United States Patent
Michel et al.

(10) Patent No.: US 9,632,865 B1
(45) Date of Patent: Apr. 25, 2017

(54) SUPERPARITY PROTECTION FOR DATA ACCESSED RESPONSIVE TO A COMMAND

(71) Applicant: Seagate Technology LLC, Cupertino, CA (US)

(72) Inventors: Richard P Michel, Mineapolis, MN (US); Narayanan Krishnamurthy, Chanhassen, MN (US); Anil Kashyap, Eden Prairie, MN (US)

(73) Assignee: SEAGATE TECHNOLOGY LLC, Cupertino, CA (US)

(*) Notice: Subject to any disclaimer, the term of this patent is extended or adjusted under 35 U.S.C. 154(b) by 87 days.

(21) Appl. No.: 14/601,990

(22) Filed: Jan. 21, 2015

(51) Int. Cl.
  *G06F 11/10* (2006.01)
  *G11B 20/18* (2006.01)
  *H03M 13/05* (2006.01)

(52) U.S. Cl.
  CPC ...... *G06F 11/1008* (2013.01); *G11B 20/1833* (2013.01); *H03M 13/05* (2013.01)

(58) Field of Classification Search
  CPC ..................................................... G06F 11/10
  USPC ................... 714/801, 755, 763, 699, 760
  See application file for complete search history.

(56) References Cited

U.S. PATENT DOCUMENTS

| | | | |
|---|---|---|---|
| 7,536,625 B2 | 5/2009 | Seng et al. | |
| 7,536,626 B2 * | 5/2009 | Sutivong | H04L 1/0045 714/760 |
| 7,827,387 B1 | 11/2010 | Kwan et al. | |
| 2007/0150774 A1 * | 6/2007 | Seng | G11B 20/1217 714/699 |
| 2009/0037644 A1 * | 2/2009 | Miller | G06F 11/1032 711/103 |

OTHER PUBLICATIONS

Wildani, et al., Protecting Against Rare Event Failures in Archival Systems, Technical Report UCSC-SSRC-09-03, Apr. 2009, Storage Systems Research Center, University of California, Santa Cruz, US.

* cited by examiner

*Primary Examiner* — Fritz Alphonse
(74) *Attorney, Agent, or Firm* — Cesari & Reed, LLP; Kirk A. Cesari; Logan Brown

(57) ABSTRACT

The disclosure is related to systems and methods of providing superparity protection to data. A storage device or other processing system, such as a host, may be capable of providing intermediate superparity protection to data. For example, superparity may be determined in response to a command received at a storage device. A superparity can be determined for read data to provide superparity protection to the read data. It may also be determined whether the read data is already protected by a valid superparity.

20 Claims, 7 Drawing Sheets

SUPERPARITY PROTECTION FOR DATA ACCESSED RESPONSIVE TO A COMMAND

SUMMARY

A processing circuit may be configured to process a read command to read a selected set of data and read the selected set from a first data storage medium in response to the read command. The processing circuit can determine a superparity for the selected set in response to the read command and store the superparity in a memory.

A method may include processing a read command for selected data stored at a storage device and determining if a first superparity corresponding to the selected data is valid in response to the read command. The method may also include determining a second superparity based on the selected data when the first superparity is not valid and storing the second superparity in a memory.

A memory device may store instructions that, when executed by a processor, cause the processor to perform a method including: retrieving selected data from a storage device in response to a read command, determining a superparity for the selected data in response to the read command, and storing the superparity in a memory.

DETAILED DESCRIPTION

Figure 1:
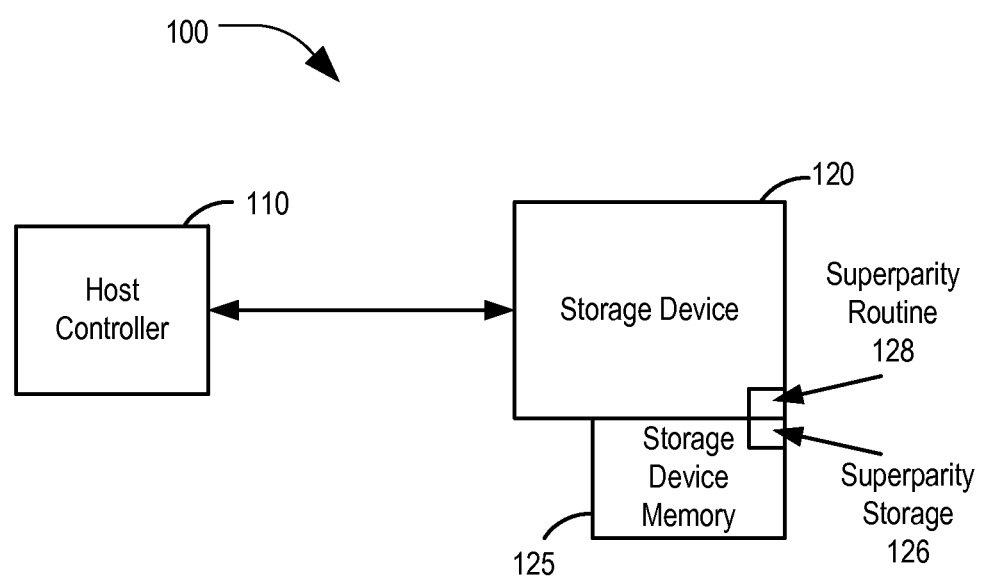
FIG. 1 is a block diagram of a system with the capability of calculating superparities, in accordance with certain embodiments of the present disclosure.

In the following detailed description of the embodiments, reference is made to the accompanying drawings which form a part hereof, and in which are shown by way of illustrations. It is to be understood that features of the various described embodiments may be combined, other embodiments may be utilized, and structural changes may be made without departing from the scope of the present disclosure. It is also to be understood that features of the various embodiments and examples herein can be combined, exchanged, or removed without departing from the scope of the present disclosure.

In accordance with various embodiments, the methods and functions described herein may be implemented as one or more software programs running on a computer processor or controller. In accordance with various embodiments, the methods and functions described herein may be implemented as one or more software programs running on a computing device, such as a storage device controller. Dedicated hardware implementations including, but not limited to, application specific integrated circuits, programmable logic arrays, and other hardware devices can likewise be constructed to implement the methods and functions described herein. Further, the methods and functions described herein may be implemented as a device, such as a computer readable storage medium or memory device, including instructions that when executed cause a processor to perform the methods.

Storage devices such as disc drives may include data storage components in the form of discs. Data may be stored on the discs in tracks. Tracks may be further include sectors in which the data on the tracks are stored. A track may be logically divided into sectors, and data on the track stored in the sectors. Each sector may have a corresponding parity which may be used to recover data in the individual sector associated with the parity. The sectors making up a track may be used to calculate a superparity for the track. The sectors making up a track may be considered to be a superset of data such that the superparity for the track protects a superset of data corresponding to a track. A superparity for a track may be stored at the end of a track. Such a superparity may be referred to as a track-based superparity.

In the event of a write to a sector of the track that results in the corresponding track-based superparity being incorrect, the track-based superparity will be invalid until a new superparity for the whole track is calculated. This may happen when a portion of the track is written and a new track-based superparity is not calculated immediately. Later, track-based superparities for tracks may be determined and updated during an "idle time" of the storage device. A track having a corresponding track-based superparity that is incorrect may be considered unprotected because the track-based superparity will not be available to correct errors.

To protect track data rendered unprotected by an invalid track-based superparity or other superparity, an intermediate superparity may be calculated for data read or written by the storage device. For example, a host device may send a read or write command to the storage device. In the event of a host read command sent to the storage device, the storage device may read data unprotected by a valid superparity. The data read in response to the host read command may be used to calculate an intermediate superparity which protects the read data. For example, multiple sectors of a track with an invalid superparity may be read in response to a host read command and also used to calculate an intermediate superparity which protects the read sectors.

As discussed above, a superparity may be determined for a track upon writing the track. In the event of a subsequent write to data used to calculate the superparity, the superparity for the track becomes invalid. In an idle state, a storage device may update superparities for tracks, for example by recalculating invalid superparities to provide valid superparity protection to tracks. When data is not protected by a valid track-based superparity because the superparity has been invalidated by a write, and a valid superparity has not yet been calculated in an idle time, a superparity may be calculated from read data, and this superparity may, in embodiments, be considered an intermediate superparity protecting the read data.

Referring to FIG. 1, certain embodiments of a system capable of determining intermediate superparities responsive to a host read command are shown and generally designated 100. The system 100 can include a host controller 110 in communication with a storage device 120. The storage device 120 may include a storage device memory 125 having a superparity storage 126 for storing an intermediate superparity, and a superparity routine 128. The superparity routine 128, which may be hardwired in the storage device 120 or may be implemented via firmware on a processor in the storage device 120, may calculate an intermediate superparity on read data in response to the storage device 120 receiving a host read command from the host controller 110. In some embodiments, the storage device memory may be solid state memory, such as dynamic random-access memory (DRAM) or NAND flash.

During operation, the host controller 110 may send a read command to the storage device 120 requesting that the storage device 120 read a set of data. If data of the set of data is not protected by a valid superparity, superparity routine 128 may be run to calculate a superparity for the read data. This superparity may be referred to as an intermediate superparity. The calculated intermediate superparity for the read data may be stored in the superparity storage 126 of the storage device memory 125 to provide superparity protection for the read data. The intermediate superparity may be stored in more than one location. For example, the intermediate superparity may be stored in the superparity storage 126 and may also be stored in a further location, which may or may not be integral to the storage device 120. In embodiments, intermediate superparities may also be stored in a media cache on the storage device 120.

Figure 2:
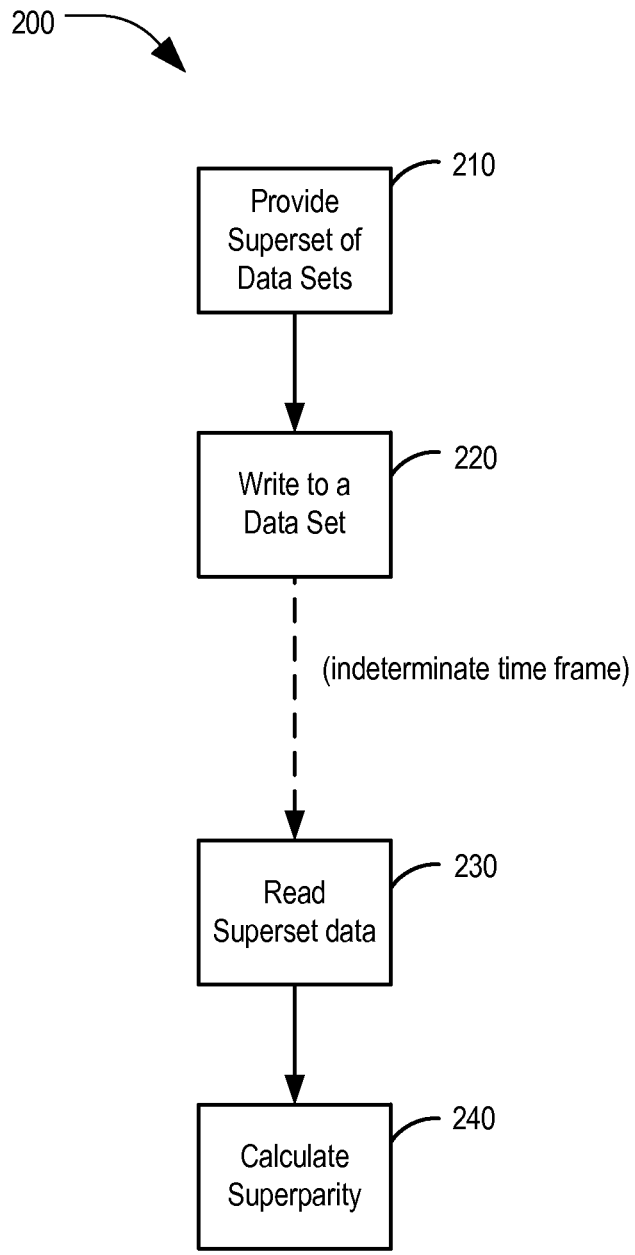
FIG. 2 is a flowchart of a method for calculating superparity, in accordance with certain embodiments of the present disclosure.

Referring to FIG. 2, certain embodiments of method for determining an intermediate superparity are shown and generally designated 200. A superset of data sets may be provided, at 210. The superset of data sets may be protected by a superparity calculated from the superset. Thus, the superparity may be calculated using every data set in the superset of data sets. Subsequent to calculation of the superparity for the superset, a data set may be written to at 220, invalidating the superparity protecting the superset and the data sets of the superset. After an indeterminate time in which the superset and the data sets of the superset are unprotected by a valid superparity, data from the superset may be read at 230, and an intermediate superparity calculated from the read data at 240 and stored. The intermediate superparity provides superparity protection to the read data. In one example, multiple data sets of the superset up to all of the data sets of the superset may be read and an intermediate superparity calculated for the read data sets, providing superparity protection for the read data sets.

FIGS. 3a to 3d are block diagrams of embodiments, elements, and components of a storage device 300 capable of storing data on a data storage medium, such as a disc.

Figure 3A:
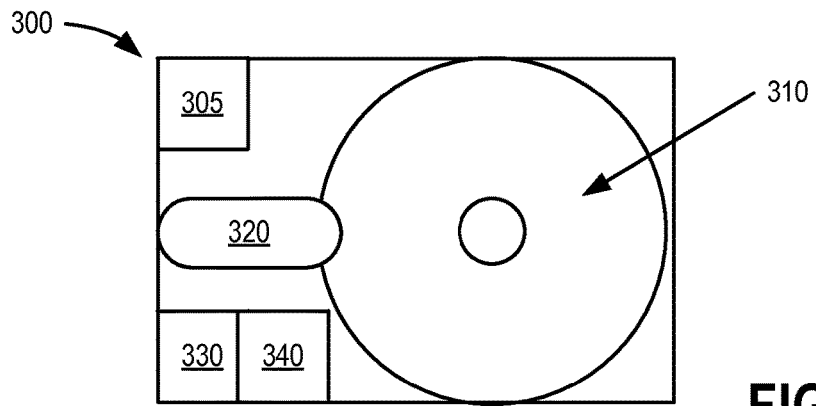
FIGS. 3a to 3d are block diagrams of embodiments, elements, and components of a storage device 300 capable of storing data on a disc, in accordance with certain embodiments of the present disclosure.

Referring to FIG. 3a, FIG. 3a is a block diagram of the storage device 300. The storage device 300 may include an interface 305, a disc 310 for storing data, a read/write head 320 for reading from and writing to the disc 310, a storage device controller 330, and a storage device memory 340 in communication with the storage device controller 330. The storage device memory 340 may include solid state memory, which may be volatile or nonvolatile, such as DRAM or flash memory. Furthermore, the storage device memory 340 may be a distinct memory component from the disc 310 in the storage device 300. In some embodiments, storage device controller 330 may calculate an intermediate superparity from data read from the disc 310 by the read/write head 320 and store the calculated intermediate superparity in the storage device memory 340.

Referring to the interface 305, the interface 305 may be a host interface which may be used to interface the storage device 300 with one or more host devices. The interface may be coupled to the storage device controller 330, allowing the storage device controller to interface with one or more host devices. The interface 305 may be a hardware, such as a physical connector, and software based interface that can be physically connected and disconnected from host devices allowing the storage device 300 to be removable from the host device.

Figure 3B:
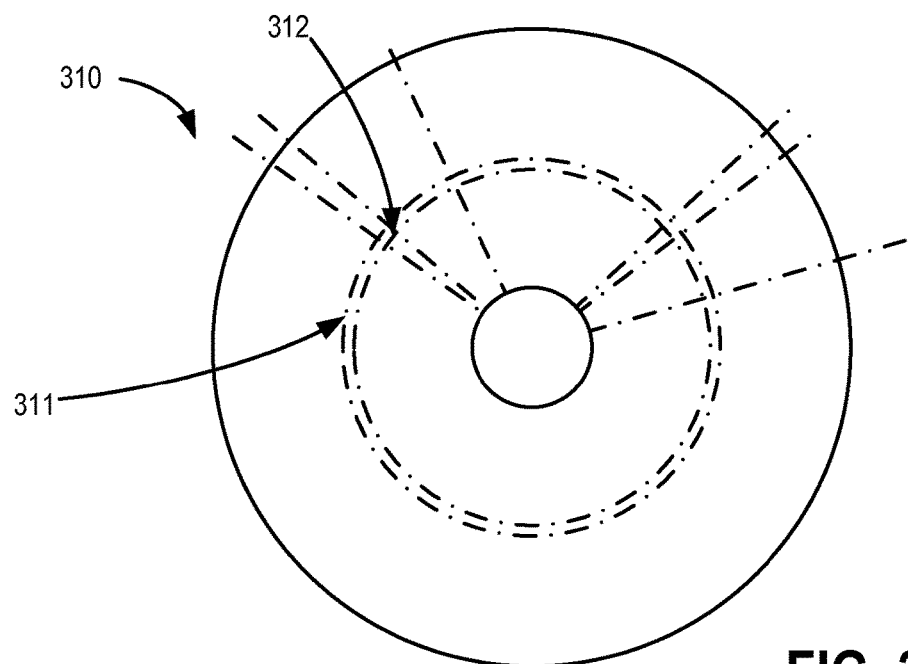

Referring to FIG. 3b, FIG. 3b is an illustration of the disc 310 of the storage device 300. The disc 310 may include one or more tracks, such as track 311, that include one or more sectors, such as sector 312, which can store data. In some embodiments of the storage device 300, a track-based superparity can be calculated for tracks on a disc and may be stored for each associated track. The track-based superparity may be stored on the corresponding track or elsewhere. In some examples, the track-based superparity may be stored at an end of a corresponding track. A superparity for a track (or any other set or superset of data) may be calculated by XORing data, for example host data, stored in the sectors of the track.

Figure 3C:
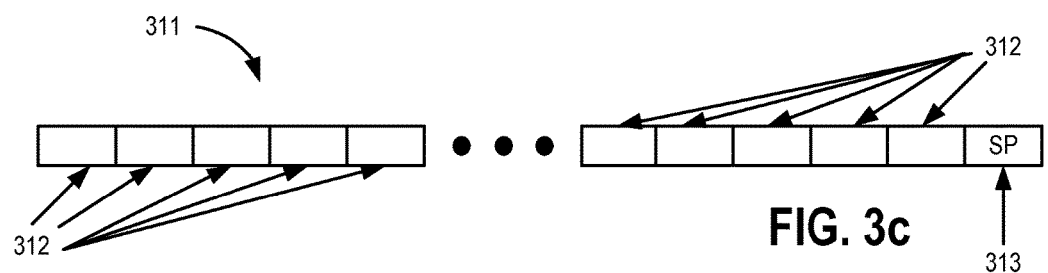

FIG. 3c is a logical representation of the track 311 and the sectors 312 of the track 311. As can be seen from FIG. 3c, the track 311 includes multiple sectors 312 in succession, at the end of the track, and following to the sectors 312, is a track-based superparity 313 which is calculated from the sectors 312 of the track 311. The superparity 313 may be calculated from the data in the sectors 312 of the track 311 by XORing all the sectors 312 in the track 311. In the event that a write occurs to one of the sectors 312 subsequent to calculating the superparity 313, superparity 313 becomes invalid, and the sectors 312 are no longer protected by a valid superparity.

Figure 3D:
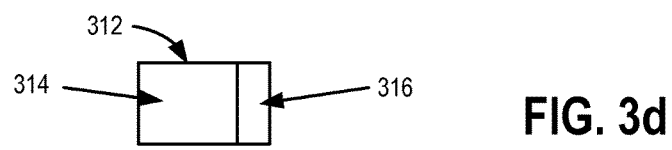

FIG. 3d is a logical representation of a sector 312 of the track 311. The sector 312 includes a data portion 314 and a parity portion 316 which may include a parity protecting the data in the data portion 314. In one example of calculating the track-based superparity 313, the superparity 313 is calculated by XORing the entirety of sectors 312, including both the data portion 314 and the parity portion 316 such that the superparity 313 is directly calculated from data portions 314 of sectors 312.

Figure 4A:
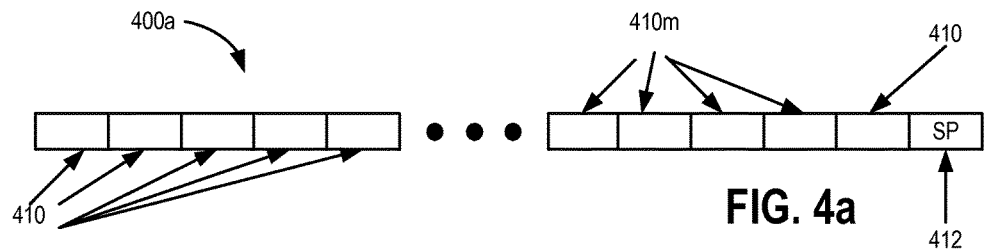
FIGS. 4a to 4c are logical representations of tracks and superparities, in accordance with certain embodiments of the present disclosure.
Figure 4B:
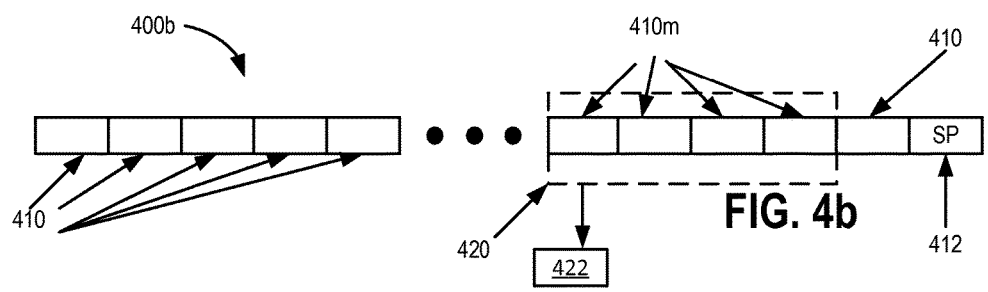
Figure 4C:
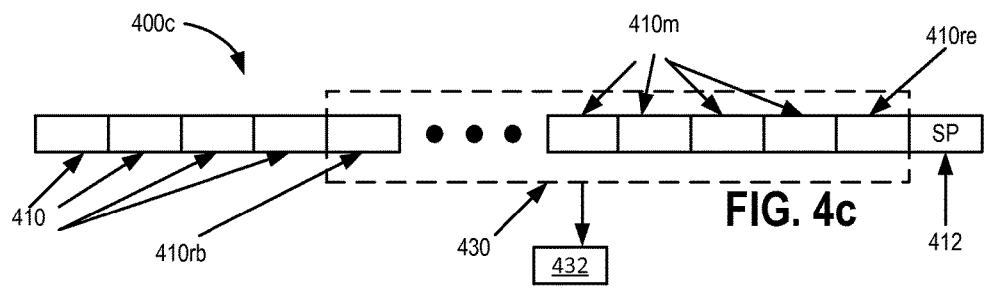

Referring to FIGS. 4a to 4c, examples of superparity calculations are illustrated in regard to disc track logical representations 400a to 400c.

Referring to FIG. 4a, a logical representation of a disc track, 400a, is illustrated. The disc track 400a has sectors 410 which include sectors 410m. At the end of the disc track 400a is located a superparity 412. The superparity 412 is calculated from all the sectors of the disc track 400a, and the superparity calculation may include one or more XOR logical operations. The superparity 412 provides protection to the sectors 410 of the disc track 400a. Subsequent to determining the superparity 412, sectors 410m are written to such that the sectors 410m are modified, for example as the result of a write command. Because of the modification of the sectors 410m, the superparity 412 becomes invalid such that it does not provide protection to the sectors 410, including sectors 410m, of the disc track 400a.

Referring to FIG. 4b, a logical representation of a disc track, 400b, is illustrated. FIG. 4b illustrates calculating an intermediate superparity responsive to a write to track sectors. When sectors 410m are written to as the result of executing a write command, the superparity 412 becomes invalid. However, the written data may be used to calculate an intermediate superparity 422 protecting the written data. More particularly, a set 420 spans a set of sectors 410m which are written to with new data. Responsive to or as part of the write command, a superparity 422 can be calculated for the sectors 410m of the set 420. The superparity 422 may be considered an intermediate superparity because superparity 422 protects the sectors 410*m* until a valid superparity may be calculated for all the sectors 410 in the track 400*b*.

Referring to FIG. 4*c*, a logical representation of a disc track, 400*c*, is illustrated. FIG. 4*c* illustrates calculating an intermediate superparity responsive to a read operation performed on sectors 410, for example a read operation performed in response to a host read command received at a storage device. In this example, sectors 410*m* have been written to such that the superparity 412 protecting sectors 410 is invalid. A set of sectors 430 is shown, the set of sectors 430 beginning at sector 410*rb* and ending at sector 410*re*. A read operation is performed on sectors in the set 430, and the read operation reads from sector 410*rb* to sector 410*re*. As part of or in addition to reading the sectors 410 in the set 430, an intermediate superparity 432 can be calculated for the sectors 410 in the set 430 such that the superparity 432 provides intermediate superparity protection to the sectors 410 in the set 430.

As may be seen from comparing FIG. 4*b* and FIG. 4*c*, empirically, a read command may span more sectors than a write command. For example, set 430 of FIG. 4*c* includes more sectors 410 than set 420 of FIG. 4*b*. Thus, the intermediate superparity 432 calculated as part of or in addition to a read command spanning set 430 protects more sectors than the intermediate superparity 422 calculated in addition to or as part of a write command for set 420.

In embodiments, a table may be maintained, for example at a storage device, and the table may indicate the validity of track-based superparities associated with tracks of a disc. For example, a table could be maintained on a disc with an entry for each track indicating the validity of the track-based superparity calculated for that track. In an idle state of a storage device, a controller of the storage device may check the table indicating the validity of track-based superparities. If a track is indicated as lacking a valid superparity, then the controller may calculate a valid superparity for the track, save the superparity at the end of the track, and update the table. In the event data is written to a track, and the track-based superparity not recalculated such that the track-based superparity is invalid, the associated entry of the table may be updated to indicate the track-based superparity associated with the track is invalid. In some embodiments, the table may be stored off-disc in a storage device, for example in DRAM or in a media cache.

Figure 5:
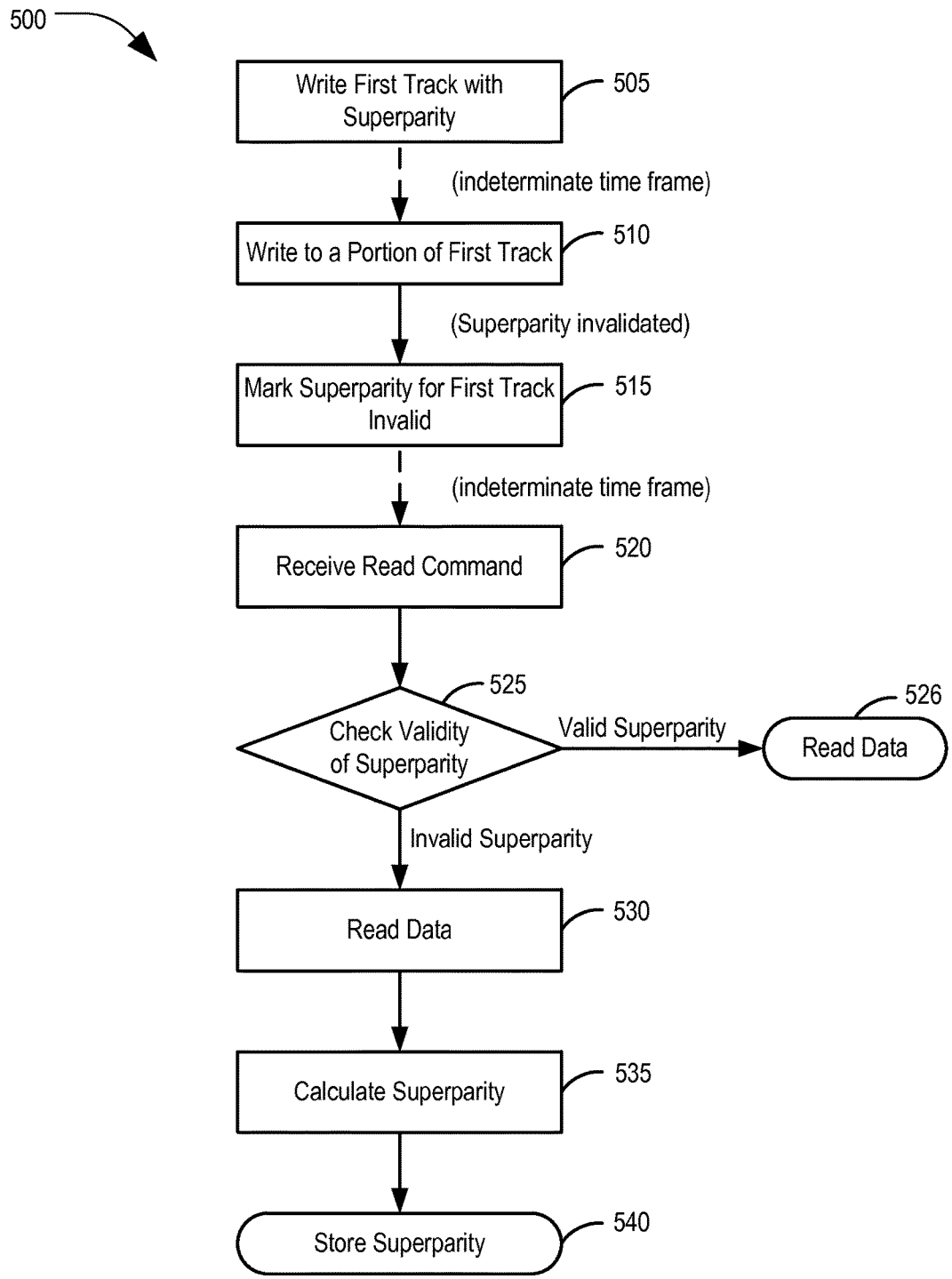
FIG. 5 is a flowchart of a method for calculating superparity, in accordance with certain embodiments of the present disclosure.

Referring to FIG. 5, FIG. 5 is a flowchart of a method 500 for calculating intermediate superparity. The method may be performed using a storage device having a disc storage and storage media distinct from the disc storage. The storage media may be DRAM or media cache storage. A first track of a disc is written and a track-based superparity determined for the track and stored at the end of the track on the disc, at 505. After an indeterminate time frame, a write operation is performed on a portion of the first track, for example on a subset of the sectors in the first track, at 510, thereby invalidating the track-based superparity of the first track. At 515, the superparity of the first track is marked as invalid in a table listing tracks and corresponding superparities for the tracks. For example, the table listing tracks and validity of corresponding superparities may be located on the storage media distinct from the disc storage in the storage device, or may be located on a disc storage medium.

After an indeterminate time frame, at 520, the storage device receives a command which may be a read command. For example, the read command may be sent from a host such as a host controller to the storage device, requesting the storage device return data stored on one or more discs of the storage device. In a simplification, the data may be stored on a portion of a track of a disc of the storage device, for example, the first track. At 525, the table listing tracks and corresponding superparity validity is checked by a controller of the storage device to check the validity of the superparity of the track data is to be read from, in this case the first track. If the table indicates the track-based superparity associated with the first track and stored on the disc subsequent to the first track is valid, then at 526, data is read from the first track in accordance with the read command, and the read data may be transferred from the storage device to the device requesting the data.

If, however, the table indicates that the track-based superparity stored after the track on the disc is invalid, as in this case, where the track-based superparity associated with the first track is invalid due to one or more writes, then at 530, data is read from the track in accordance with the read command, in this case, the first track, and at 535, an intermediate superparity is determined from the read data which provides superparity protection for the read data. In an embodiment, determining the superparity includes performing multiple XOR operations on the data from the first track as the data is read from the first track. The read data is returned to the requester of the data. At 540, the intermediate superparity is stored, for example, the intermediate superparity may be stored on the storage media distinct from the disc storage. The intermediate superparity provides superparity protection for the data read from the first track. If the data is read from the first track in sectors, then the intermediate superparity provides superparity protection for the read sectors.

While in the example of FIG. 5, data is read from a single track, in other embodiments, data may be read from multiple tracks and different sectors of different tracks. In examples, intermediate superparities may be calculated for read data and sectors on a per track basis, such that if a read command reads sectors of data from different tracks, an intermediate superparity is calculated for data read from each track, such that there will be an intermediate superparity for each track data is read from providing superparity protection for the data read from the respective track. For example, when a command accesses blocks from more than one track, then intermediate superparity may be calculated for each fragment of each track. There may be a limit to how many data sets can be incorporated into one super set that is imposed by parameters of the encoding process. In embodiments of drives the limit may be 4096. Current disk drives may have less than 4096 blocks per track.

In a further example, a read command can span multiple tracks, such that more than one track is read in response to a read command. An intermediate superparity may be calculated from the read tracks and provide superparity protection to data in the read tracks. In embodiments, limits may be imposed by the encoding details.

In embodiments, intermediate superparities may be calculated during a NOT idle state of a storage device. For example, a superparity determined in response to a read command from a host is determined when the storage device is not in an idle state. In some embodiments, intermediate superparities are determined in response to host requests from a host to a storage device, for example, a read command sent from a host controller to a storage device.

Figure 6:
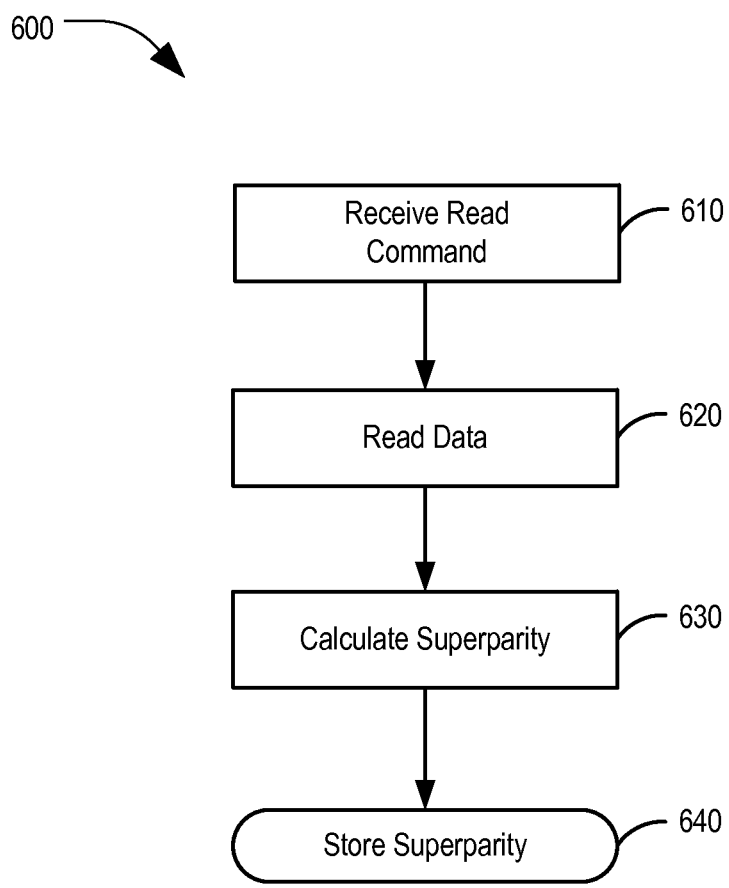
FIG. 6 is a flowchart of a method for calculating superparity, in accordance with certain embodiments of the present disclosure.

Referring to FIG. 6, FIG. 6 is a flowchart of a method 600 for calculating intermediate superparity. The method may be performed using a storage device having a disc storage and storage media distinct from the disc storage. The storage media may include solid state media. A read command is received at the storage device, at 610, such that the storage device is in a not idle state, but is, for example, in an active state. In some embodiments, an active state is a state when a queue of commands sent by the host is being processed by the drive. In some embodiments, an idle state is a state when no commands sent by the host are pending. The read command may be sent to the storage device from a host device such that the read command is a host read command. The storage device reads multiple sets of data in accordance with the read command, for example in the case of a disc storage, multiple block addresses of a disc, at 620. A superparity is calculated from the read sets of data, at 630. Calculating the superparity may comprise performing XOR logical operations on sets of read data. The superparity is stored on the storage media, at 640.

One embodiment of superparity calculation may be: If i is the index of the bit within a data set, and j is the index of the data set included in the super set, then SuperparityBit(i)=DataSetBit(i,0) XOR DataSetBit(i,1) XOR DataSetBit(i,2) . . . XOR DataSetBit(i,j).

In some embodiments, an intermediate superparity is stored on a separate media from the media on which the data protected by the intermediate superparity is stored. For example, in the case of a storage device with one or more discs storing data in tracks, intermediate superparities determined in response to a host read command may be stored on a separate storage media in the storage device from the discs, such as in DRAM or in the media cache of the storage device. In a further example, intermediate superparities may initially be stored in DRAM, but may be moved to the media cache if the size of the superparity data exceeds an allocated DRAM space.

While in the above, the track-based superparity protecting an entire track of data is stored at the end of the respective track, in other embodiments, a storage media such as a disc may have an on-media directory in which the track-based superparity is stored.

In embodiments, the table indicating the validity of the superparities may be stored in DRAM. For example, a table of tracks may be stored in DRAM, and there may be an entry for a track-based superparity for each track. The value of the entry may indicate the validity of the track-based superparity for the corresponding track in the table. The parity validity table may be stored in DRAM so that it can be changed with every write and kept up to date without slowing the drive operation. For the intermediate superparity validity table, the track address and the address of the beginning and end of the super set may be stored in DRAM; in embodiments, the associated intermediate superparity may also be stored in an entry associated with the track address. The intermediate super parity blocks can be stored on the media periodically when the DRAM threshold is reached.

With regard to an on-media directory, in an idle state, the storage device with the on-media directory may rebuild the directory by calculating valid track-based superparities for tracks with no valid track-based superparity protection, and storing the superparities in the directory, and otherwise managing memory.

A storage device may maintain a table indicating intermediate superparity protection for data blocks in tracks. For example, a table may be maintained listing block addresses of data blocks protected by a respective intermediate superparity. This table may be updated when new data blocks are read and a corresponding intermediate superparity calculated, and may also be updated in the event a write to a block invalidates an intermediate superparity.

Still further, while in the above, embodiments have generally been discussed in regard to a disc with tracks capable of storing data, this is by way of example, not limitation. The principles and concepts set forth herein may be applied to any superset of datasets stored on a storage media which is read in response to a read command. Further, the principles and concepts set forth herein may be applied to any processor or controller which reads or receives data, whether it is within a storage device, a host, a network, or server; for example, a network.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown. Further, embodiments may include any parts or any combination of steps, elements, or parts illustrated in FIGS. 1 to 6. For example, embodiments may omit illustrated elements of the methods, or combine method elements, or perform aspects in a differing sequence than illustrated or described.

This disclosure is intended to cover any and all subsequent adaptations or variations of various embodiments. Combinations of the above examples, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A device comprising:
a processing circuit configured to:
 process a read command to read a selected set of data, the read command from a host device;
 receive the selected set from a first data storage medium in response to the read command from the host device;
 determine a superparity for the selected set in response to the read command from the host device; and
 store the determined superparity in a memory in response to the read command from the host device.

2. The device of claim 1, further comprising:
the first data storage medium; and
a processor configured to store a superset of data to the first data storage medium with a corresponding superset superparity, the superset of data including multiple sets of data and the corresponding superset superparity calculated based on all of the multiple sets of data.

3. The device of claim 2 further comprising:
the memory is a second data storage medium different than the first data storage medium.

4. The device of claim 3, further comprising the first data storage medium includes a disc data storage medium and the second data storage medium includes a solid state memory.

5. The device of claim 1, further comprising an interface coupled to the processing circuit and configured to receive the read command from a host device, the interface including a hardware connector to allow the device to be disconnected from the host device.

6. The device of claim 1, further comprising the processing circuit configured to:
determine a validity of a superset superparity, which was calculated based on a superset of multiple data sets including the selected set, in response to the read command; and
determine the superparity for the selected set when the superset superparity is not valid.

7. The device of claim 2, the storage device further configured to maintain a table indicating the validity of the superset superparity, the table including multiple entries, each entry corresponding to a track and having a corresponding indicator indicating a validity of a superparity corresponding to the respective track.

8. The device of claim 7, the superset corresponding to a track of a disc data storage medium.

9. A method comprising:
processing a read command for selected data stored at a storage device, the read command from a host device;
determining if a first superparity corresponding to the selected data is valid in response to the read command from the host device;
when the first superparity is not valid, determining a second superparity based on the selected data in response to the read command from the host device; and
storing the determined second superparity in a memory in response to the read command from the host device.

10. The method of claim 9, further comprising:
receiving the read command at a data storage device; and
performing, at the data storage device, the processing the read command, determining if the first super parity is valid, and determining the second super parity.

11. The method of claim 9, further comprising:
reading the selected data from a memory; and
determining the second superparity based on the selected data after it is read.

12. The method of claim 9, further comprising the determining the second superparity includes performing one or more logical XOR operations with regard to the data sets of the set.

13. The method of claim 9, further comprising calculating the first superparity from a superset of data, the superset of data including at least a portion of the selected data.

14. The method of claim 9, further comprising the selected data includes a subset of data of a superset of data stored on a data storage medium.

15. The method of claim 14, further comprising the first superparity corresponding to a track of a disc, where the superset is all host data on the track and the subset is a portion less than all of the host data on the track.

16. A memory device storing instructions that, when executed by a processor, cause the processor to perform a method comprising:
retrieving selected data from a storage device in response to a read command from a host device;
determining a superparity for the selected data in response to the read command from the host device; and
storing the superparity in a memory in response to the read command from the host device.

17. The memory device of claim 16, further comprising a data storage device including the processor and the data storage device configured to perform the method in a not idle state in response to receiving the read command.

18. The memory device of claim 16, further comprising determining if a superset superparity calculated from a superset of data is valid, the superset of data including at least a portion of the selected data.

19. The memory device of claim 18, the superset of data corresponding to a track of a disc data storage medium, and the memory distinct from the disc data storage medium.

20. The memory device of claim 16, further comprising the selected data including data from two or more tracks of a disc data storage medium.

* * * * *